(12) United States Patent
Matsui et al.

(10) Patent No.: US 6,875,088 B2
(45) Date of Patent: Apr. 5, 2005

(54) POLISHING MEMBER AND METHOD OF MANUFACTURING SEMICONDUCTOR DEVICE

(75) Inventors: Yukiteru Matsui, Yokohama (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/619,480

(22) Filed: Jul. 16, 2003

(65) Prior Publication Data

US 2004/0072505 A1 Apr. 15, 2004

(30) Foreign Application Priority Data

Jul. 16, 2002 (JP) ........................................ 2002-207323

(51) Int. Cl.[7] .............................................. B24B 1/00
(52) U.S. Cl. .......................................... 451/41; 451/526
(58) Field of Search .......................... 451/41, 526, 533, 451/539

(56) References Cited

U.S. PATENT DOCUMENTS 6,364,744 B1    4/2002 Merchant et al.
6,383,065 B1 *  5/2002 Grumbine et al. .......... 451/526
6,435,947 B2 *  8/2002 Mueller et al. ................ 451/41

FOREIGN PATENT DOCUMENTS

JP          2001-308041       11/2001

OTHER PUBLICATIONS

Matsui, Y. et al., "Chemical Mechanical Polishing Slurry Containing Abrasive Particles Exhibiting Photocatalytic Function", U.S. Appl. No. 10/201,488, filed Jul. 24, 2002.

* cited by examiner

*Primary Examiner*—Dung Van Nguyen
(74) *Attorney, Agent, or Firm*—Finnegan, Henderson, Farabow, Garrett & Dunner, L.L.P.

(57) ABSTRACT

There is provide a polishing member including photocatalyst particles that exhibit photocatalysis on light irradiation, and a support material that supports the photocatalyst particles. There is also provided a method of manufacturing a semiconductor device, including polishing a surface of a workpiece that is to be used as at least a portion of the semiconductor device with the polishing member with a fluid interposed between the polishing member and the surface of the workpiece while performing light irradiation onto the polishing member.

26 Claims, 7 Drawing Sheets

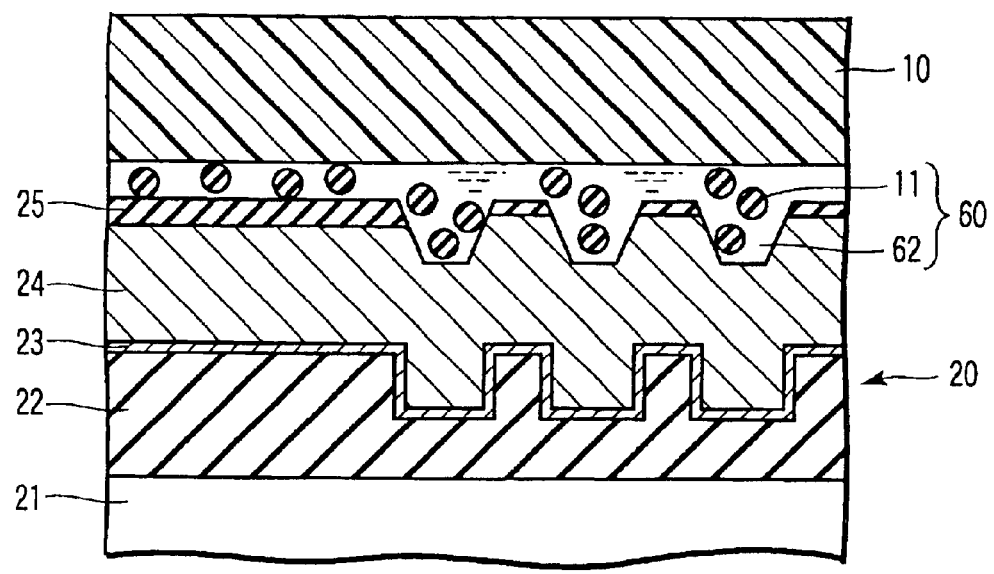
F I G. 7A
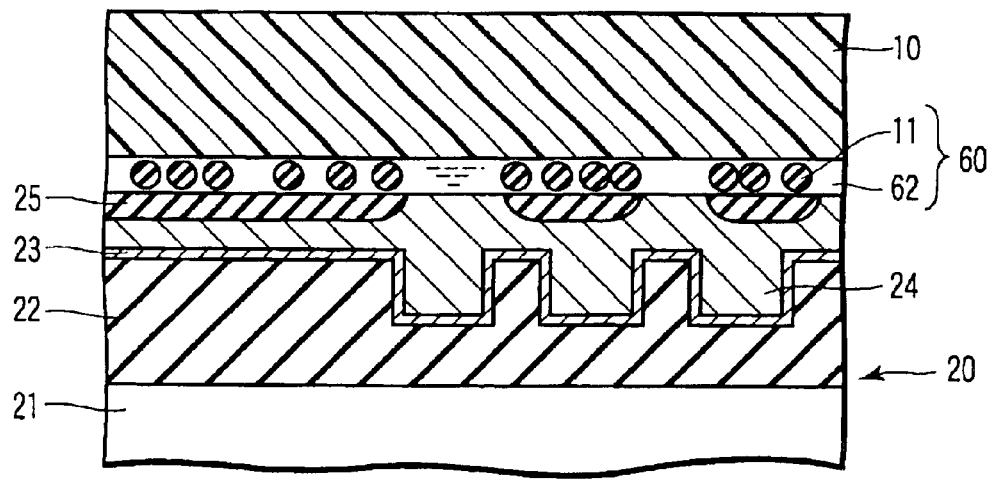
F I G. 7B

POLISHING MEMBER AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2002-207323, filed Jul. 16, 2002, the entire contents of which are incorporated herein by reference.

BACKGROUND OF THE INVENTION

1. Field of the Invention

The present invention relates to a polishing member and a method of manufacturing a semiconductor device, particularly, to a polishing member used in the manufacturing process of a semiconductor device and a method of manufacturing a semiconductor device including a planarizing treatment using the polishing member.

2. Description of the Related Art

In recent years, a marked progress has been achieved in the field of semiconductor devices in respect of the miniaturization of the device and the improvement in the element density, and intense research is being carried out in an attempt to further improve the fineness of the semiconductor device. Particularly, a CMP (Chemical Mechanical Polishing) technology is indispensable for forming, for example, a buried wiring (damascene wiring).

In the metal CMP technology that can be utilized for forming a buried wiring of a metal such as copper or aluminum, it is desirable to realize a high polishing rate and a high planarity and to suppress the scratch generation. Therefore, the polishing member used in the CMP treatment is required to be capable of holding the slurry, to be capable of following the warp of the wafer, and to have a suitable rigidity. Such being the situation, a polishing pad made of resin, for example, a closed-cell foamed resin or an open-cell foamed resin, is used mainly as the polishing member in the CMP treatment.

However, the polishing pad made of resin is hydrophobic. On the other hand, a major portion of the processing waste generated during the CMP treatment is also hydrophobic. What should be noted is that the hydrophobic processing waste is unlikely to be discharged to the outside promptly through the clearance between the polishing surface of the polishing pad and the polished surface of the semiconductor wafer. Unless the processing waste is promptly discharged to the outside through the clearance noted above, scratches are generated at a very high rate.

What should also be noted is that the hydrophobic processing waste tends to be attached easily to the polishing surface, with the result that the loading of the polishing pad is also generated at a high rate. If the polishing pad is loaded, the polishing rate and the planarity of the polished surface are markedly lowered, making it necessary to carry out a so-called "dressing", in which the surface region of the pad is removed to regenerate the function of the pad, more frequently.

BRIEF SUMMARY OF THE INVENTION

According to a first aspect of the present invention, there is provided a polishing member comprising photocatalyst particles that exhibit photocatalysis on light irradiation, and a support material that supports the photocatalyst particles.

According to a second aspect of the present invention, there is provided a method of manufacturing a semiconductor device, comprising polishing a surface of a workpiece that is to be used as at least a portion of the semiconductor device with a polishing member with a fluid interposed between the polishing member and the surface of the workpiece while performing light irradiation onto the polishing member, the polishing member comprising photocatalyst particles that exhibit photocatalysis on the light irradiation and a support material that supports the photocatalyst particles.

BRIEF DESCRIPTION OF THE SEVERAL VIEWS OF THE DRAWING

FIGS. 7A and 7B are cross-sectional views schematically showing the CMP treatment according to Comparative Example 3;

DETAILED DESCRIPTION OF THE INVENTION

Figure 1:
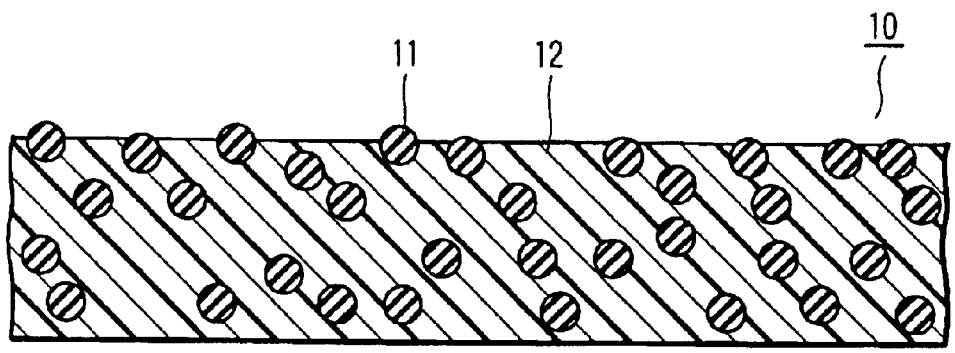
FIG. 1 is a cross-sectional view schematically showing a polishing member according to a first embodiment of the present invention.

Some embodiments of the present invention will now be described with reference to the accompanying drawings. Incidentally, the constituting elements performing the same or similar function are denoted by the same reference numerals so as to avoid the overlapping description.

First Embodiment

FIG. 1 is a cross-sectional view schematically showing a polishing member according to a first embodiment of the present invention. A polishing member 10 shown in FIG. 1 includes photocatalyst particles 11 and a support material 12.

The photocatalyst particles 11 exhibit photocatalysis upon irradiation with light having a prescribed wavelength. The photocatalysis noted above implies, for example, that the hydrophilic degree of the particles 11 is increased by the light irradiation, and that the oxidizing power and/or reducing power of the particles 11 is changed by the light irradiation. The photocatalyst particles 11 includes the particles containing any of, for example, titanium oxide, tin oxide, niobium oxide, iron oxide, cadmium selenide and cadmium sulfide.

The support material 12 supports the photocatalyst particles 11 such that at least some of these photocatalyst particles are positioned on the polishing surface. It is possible for the support material 12 to be a porous material layer, a non-porous material layer or a laminate of a porous material layer and a non-porous material layer. Alternatively, it is also possible for the support material 12 to be interposed between the photocatalyst particles so as to act as a binder for making integral the photocatalyst particles 11. As the material of the support material 12, a polystyrene resin, a phenolic resin, an aminoplast resin, a urethane resin, an epoxy resin, an acrylic resin, an acrylated isocyanurate resin, an acrylated urethane resin, an acrylated epoxy resin, glue, a mixture thereof, etc. can be utilized.

Where the support material 12 includes a porous material layer, it is possible for the porous material layer to have an open-cell structure or a closed-cell structure. The porous material layer having an open-cell structure is formed of, for example, a composite material including fibers and a binder joining these fibers together. On the other hand, the porous material layer having a closed-cell structure includes, for example, a layer containing foam such as chemically foamed plastics and mechanically foamed plastics.

The polishing member 10 such as a polishing pad or a polishing cloth including a porous material layer having an open-cell structure as the support material 12 can be obtained by, for example, allowing an aggregate of fibers such as a nonwoven fabric to be impregnated with a dispersion containing the photocatalyst particles 11, a resin and, as desired, a solvent, followed by removing the solvent and/or curing the resin. On the other hand, the polishing member 10 such as a polishing pad or a polishing cloth including a porous material layer having a closed-cell structure as the support material 12 can be obtained by, for example, foam molding a mixture containing the material of the support material 12 and the photocatalyst particles 11.

The polishing member 10 such as a polishing pad or a polishing cloth including a non-porous material layer as the support material 12 can be obtained by, for example, casting a mixture containing the photocatalyst particles 11, a resin and, as desired, a solvent. Further, the polishing member 10 such as a grindstone containing the support material 12 as a binder and having the photocatalyst particles 11 made integral by the function of the binder can be obtained by, for example, compression molding a mixture containing the photocatalyst particles 11 and a binder such as a resin.

The polishing member 10 according to the first embodiment of the present invention includes the photocatalyst particles 11 exhibiting the photocatalysis upon irradiation light having a prescribed wavelength, as described above. Therefore, it is possible to make the polishing surface of the polishing member 10 hydrophilic by irradiating the polishing surface with light having a prescribed wavelength. It follows that it is possible to permit the hydrophobic processing waste, which is generated during the CMP treatment applied to a workpiece such as a substrate, to be promptly discharged to the outside through the clearance between the polishing surface of the polishing member 10 and the polished surface of the substrate. As a result, it is possible to suppress the scratch generation.

It should also be noted that, if the polishing surface of the polishing member 10 is irradiated with light having a prescribed wavelength, the hydrophobic processing waste is rendered unlikely to be attached to the polishing surface of the polishing member 10. As a result, the polishing member 10 is unlikely to be loaded so as to make it unnecessary to carry out the dressing frequently.

Further, if the light irradiation is stopped, the polishing surface of the polishing member 10 can be made hydrophobic. It follows that, even if hydrophilic processing waste and reaction products are attached to the polishing surface of the polishing member 10, they can be easily removed.

As described above, according to the first embodiment, the polishing surface of the polishing member 10 can be made hydrophobic or hydrophilic by controlling the light irradiation. In addition, in the case of using the polishing member 10, it is possible to carry out a planarizing treatment by the method described in the following with reference to FIG. 2.

Figure 2:
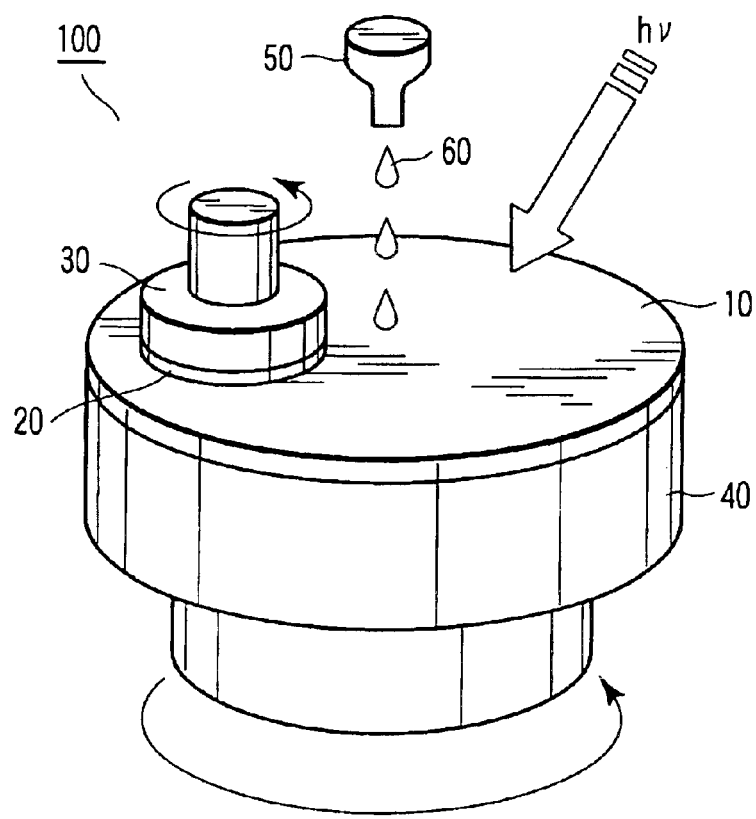
FIG. 2 is an oblique view schematically showing the planarizing treatment according to the first embodiment of the present invention.

FIG. 2 is an oblique view schematically showing the planarizing treatment according to the first embodiment of the present invention. The gist portion of a CMP apparatus is depicted in FIG. 2. As shown in the drawing, the CMP apparatus 100 includes a head (or a carrier) 30 detachably supporting a substrate 20 that is to be subjected to a CMP treatment, a turntable 40 detachably supporting a polishing member 10, a driving mechanism for rotating the head 30 and the turntable 40 in a direction denoted by arrows, a nozzle 50 forming a part of a fluid supply mechanism for supplying a fluid 60 onto the polishing member 10, and a light source (not shown) for irradiating the polishing member 10 with light.

In the planarizing treatment using the CMP apparatus 100, the fluid 60 is supplied from the nozzle 50 onto the central portion of the polishing member 10, and each of the head 30 and the turntable 40 is rotated in the direction denoted by the arrow while irradiating the polishing member 10 with light. The fluid 60 supplied onto the polishing member 10 is centrifugally moved from the central portion toward the peripheral portion of the polishing member 10. As shown in the drawing, the head 30 is positioned to face that region of the polishing member 10 which is intermediate between the center and the periphery of the polishing member 10. As a result, the fluid 60 is supplied into a region between the polishing member 10 and the substrate 20. The surface of the substrate 20 is polished by the polishing surface of the polishing member 10 under the state that the fluid 60 is interposed between the polishing member 10 and the substrate 20.

As described previously, the polishing member 10 includes the photocatalyst particles 11. These photocatalyst particles 11 can also be utilized as abrasive particles. It follows that it is possible for the fluid 60 supplied from the nozzle 50 onto the polishing member 10 to be a slurry containing abrasive particles or to be a liquid material that does not contain abrasive particles.

As described above, the oxidizing force and/or the reducing force of the photocatalyst particles 11 is changed according to the light irradiation. Therefore, it is possible to utilize the photocatalyst particles 11 as, for example, an oxidant. To be more specific, it is possible for the fluid 60 supplied from the nozzle 50 onto the polishing member 10 to contain or not to contain an oxidant.

It follows that, according to the first embodiment, it is possible to use a liquid that does not contain abrasive particles or oxidants as the fluid 60 supplied from the nozzle 50 onto the polishing member 10. An example of a planarizing treatment using such a liquid will now be described.

EXAMPLE 1

FIGS. 3A to 3D are cross-sectional views schematically showing the manufacturing method of a semiconductor device according to Example 1 of the present invention. Incidentally, FIGS. 3A to 3D are depicted upside down.

In Example 1, an interlayer insulating film 22 is formed first on a semiconductor substrate 21, followed by forming trenches in the interlayer insulating film 22 by utilizing, for example, a dry etching process. Then, a barrier layer 23 such as a TaN layer is formed on the interlayer insulating film 22, followed by forming an electrically conductive film 24, for example, a metal film containing a metal such as copper as a main component, on the barrier layer 23 such that the conductive film 24 is buried in the trenches formed in the interlayer insulating film 22. As a result, obtained is a substrate 20 including the metal film 23 and the barrier layer 23, which are to be polished. In Example 1, a silicon wafer was used as the semiconductor substrate 21, and a silicon oxide film was formed as the interlayer insulating film 22. Also, a copper layer was formed as the metal film 24.

Figure 3A:
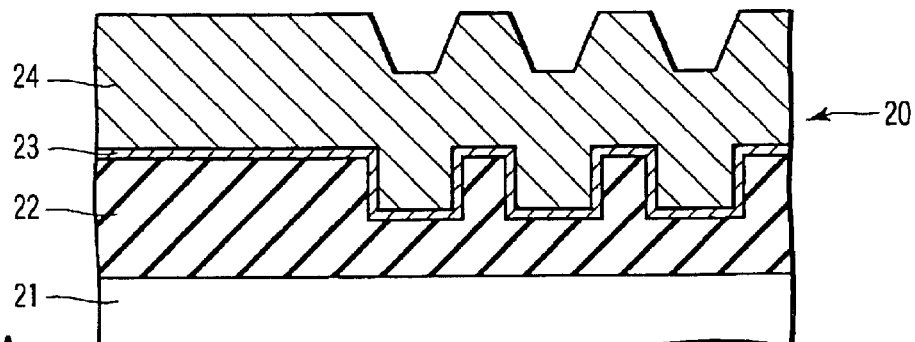
FIGS. 3A to 3D are cross-sectional views schematically showing the manufacturing method of a semiconductor device according to Example 1 of the present invention.
Figure 3B:
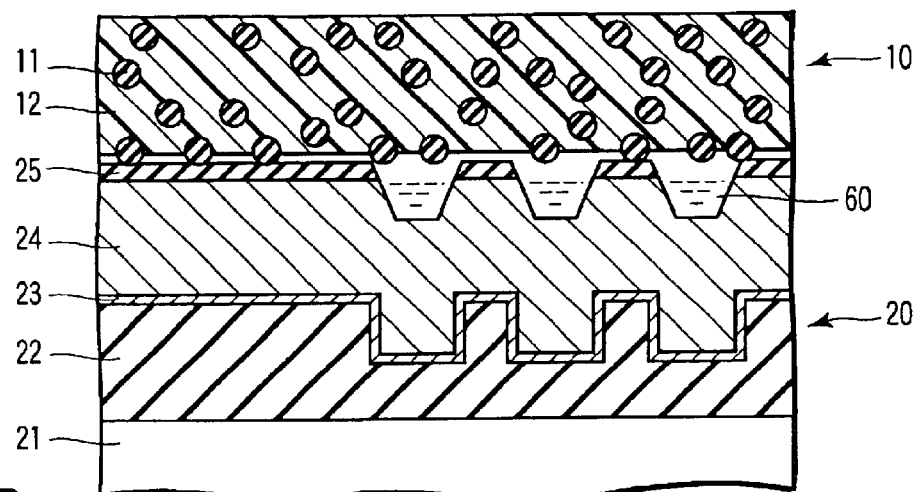
Figure 3C:
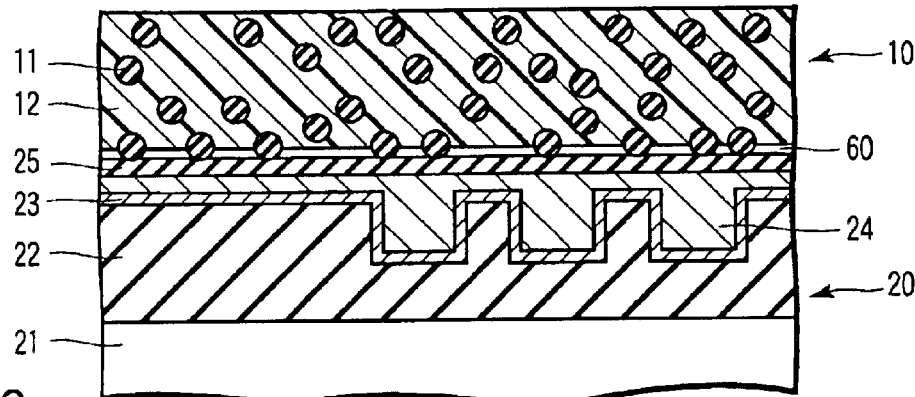

Next, by using the CMP apparatus shown in FIG. 2, the metal film 24 is polished as shown in FIGS. 3B and 3C, followed by polishing the barrier layer 23. To be more specific, the fluid 60 is supplied from the nozzle 50 onto the polishing member 10, and each of the head 30 and the table 40 is rotated while irradiating the polishing member 10 with light.

In this Example, titanium oxide particles having the primary particle diameters distributed within a range of between 5 nm and 20 nm and having an anatase type crystal structure were used as the photocatalyst particles (abrasive particles) 11 of the polishing member 10, and polystyrene was used as the support material 12. The abrasive particles 11 were contained in the polishing member 10 in a concentration of about 30% by volume. Further, a solution having a pH value of 3 and contains pure water and nitric acid, used as a pH control agent, was used as the fluid 60. During the planarizing treatment, a mercury lamp of 500W was kept turned on, the load was set at about 2.9 N/m² (300 gf/cm²), the head 30 was rotated at a rotation speed of about 100 rpm, the turntable 40 was rotated at a rotation speed of about 100 rpm, and the fluid supply rate was set at 200 cc/min.

Where the abrasive particles 11 are, for example, titanium oxide particles having the oxidizing power increased by the light irradiation, that portion of the metal layer 24 which is in contact with the abrasive particles 11 or which is in the vicinity of the abrasive particles 11 is oxidized so as to form a denatured layer 25. In this case, a brittle $CuO_x$ layer is formed as the denatured layer 25. Since the $CuO_x$ layer can be polished more easily than the copper layer, the formed denatured layer 25 is removed more promptly by the abrasive particles 11.

Figure 3D:
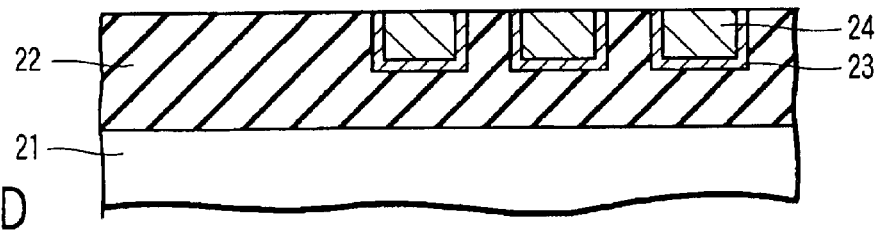

By the particular method described above, the metal layer 24 and the barrier layer 23 are polished until the upper surface of the interlayer insulating film 22 is exposed to the outside, thereby obtaining the structure as shown in FIG. 3D.

COMPARATIVE EXAMPLE 1

A CMP treatment was applied to the structure as shown in FIG. 3A by a method similar to that described in Example 1, except that a polishing pad that did not contain abrasive particles was used as the polishing member 10, and a slurry containing abrasive particles that did not exhibit the photocatalysis and a solution containing an oxidant, etc. was used as the fluid 60. To be more specific, IC1000 manufactured by Rodel Inc. was used as the polishing pad 10. Also, a slurry containing pure water, alumina particles used as abrasive particles, ammonium persulfate used as an oxidant and quinaldine acid used an additive was used as the fluid 60. Incidentally, the polishing pad 10 was not irradiated with light during the CMP treatment.

COMPARATIVE EXAMPLE 2

A CMP treatment was applied to the structure as shown in FIG. 3A by a method similar to that described in Example 1, except that a polishing pad containing abrasive particles which did not exhibit the photocatalysis was used as the polishing member 10, and a solution containing an oxidant, etc. was used as the fluid 60. To be more specific, the polishing pad 10 containing alumina particles as the abrasive particles was used in this Comparative Example. Also, a solution containing pure water, ammonium persulfate used as an oxidant and quinaldine acid used an additive was used as the fluid 60. Incidentally, the polishing pad 10 was not irradiated with light during the CMP treatment.

COMPARATIVE EXAMPLE 3

A CMP treatment was applied to the structure as shown in FIG. 3A by a method similar to that described in Example 1, except that a polishing pad that did not contain abrasive particles was used as the polishing member 10, and a slurry containing abrasive particles exhibiting the photocatalysis was used as the fluid 60. To be more specific, IC1000 manufactured by Rodel Inc. was used as the polishing pad 10. Also, a slurry containing a pure water, a pH control agent, and titanium oxide particles was used as the fluid 60. Incidentally, the polishing pad 10 was irradiated with light during the CMP treatment under the conditions similar to those for Example 1.

Figure 4A:
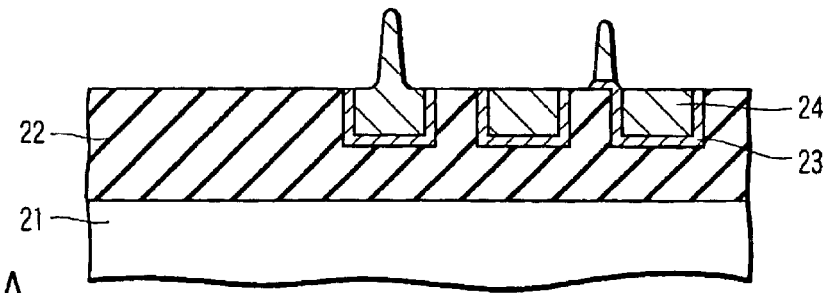
FIG. 4A is a cross-sectional view showing the island-like residual portion.
Figure 4B:
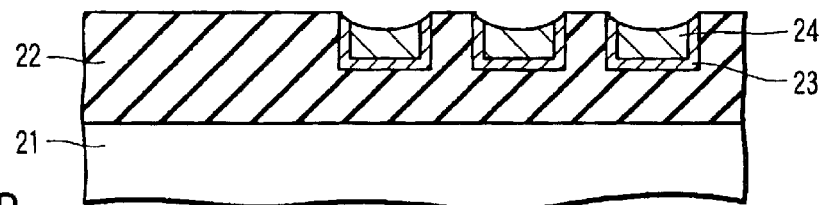
FIG. 4B is a cross-sectional view showing the dishing and/or erosion.

Then, the constructions obtained by the processes of Example 1 and Comparative Examples 1 to 3 were examined. The results are shown in the table given below together with the polishing member used, the kind of fluid, and the polishing rate. Incidentally, the "metal residue" given in the following table represents the island-shaped residual portion of the metal layer 24 positioned higher than the upper surface of the interlayer insulating film 22 as shown in FIG. 4A. Also, the "dishing+erosion" given in the following table represents the longest distance between the upper surface of the wiring 24 in which the dishing and/or erosion took place and the upper surface of the interlayer insulating film 22.

|  |  | Example 1 | Comparative example 1 | Comparative example 2 | Comparative example 3 |
| --- | --- | --- | --- | --- | --- |
| Polishing member |  | Pad with fixed abrasives (Titania particles) | IC1000 | Pad with fixed abrasives (Alumina particles) | IC1000 |
| Slurry | Abrasive particles | — | Alumina particles | — | Titania particles |
|  | Oxidant | — | Ammonium persulfate | Ammonium persulfate | — |
|  | Additive | pH adjuster | Quinaldic acid | Quinaldic acid | pH adjuster |
|  | Solvent | Pure water | Pure water | Pure water | Pure water |
| Polishing rate (nm/min) |  | 1000–2500 | 100–200 | 200–300 | 450–1000 |
| Dishing + Erosion (nm) |  | 50 | 100 | 80 | 60 |
| Number of scratches |  | Not many | Many | Many | Medium |
| Number of metal residues |  | Not many | Not many | Not many | Many |

As shown in the table given above, Example 1 has been found to be capable of achieving a markedly high polishing rate, compared with Comparative Examples 1 to 3. In addition, Example 1 has been found to be capable of prominently suppressing the generation of dishing, erosion, scratch and metal residue, compared with Comparative Examples 1 to 3.

The reasons for the prominent differences between Example 1 and Comparative Examples 1 to 3 pointed out above are considered to be as follows.

Figure 5A:
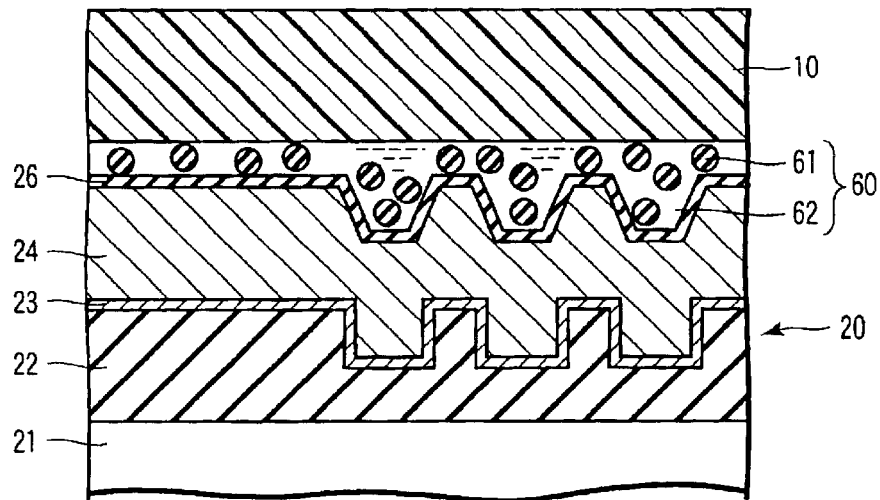
FIGS. 5A and 5B are cross-sectional views schematically showing the CMP treatment according to Comparative Example 1.
Figure 5B:
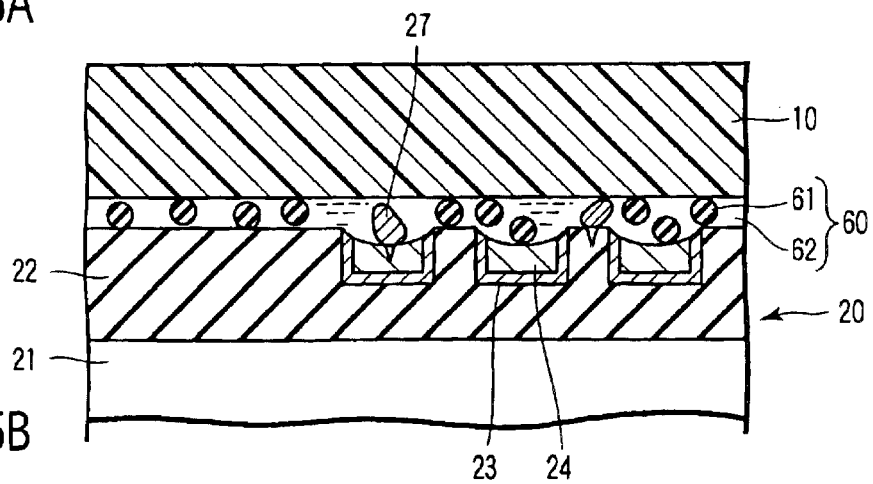
Figure 6A:
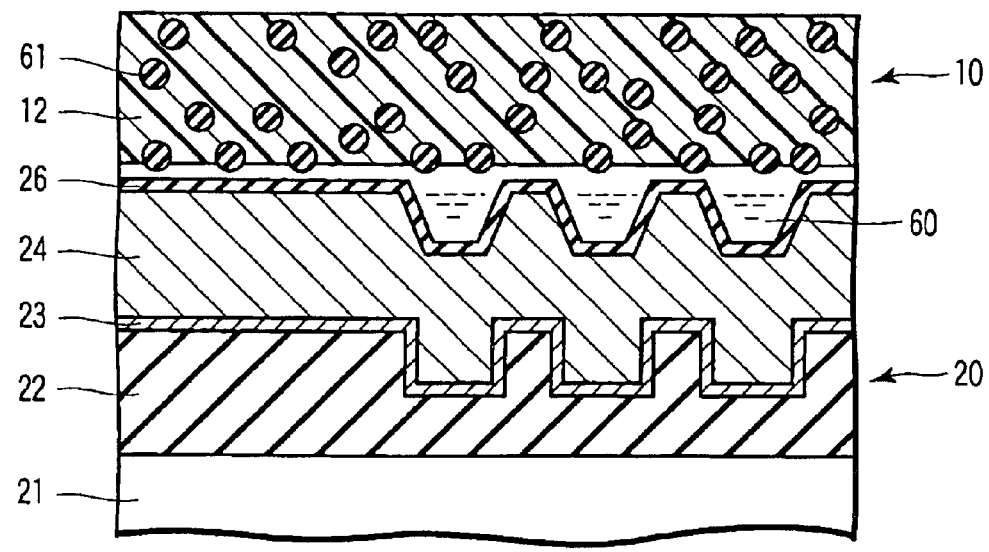
FIGS. 6A and 6B are cross-sectional views schematically showing the CMP treatment according to Comparative Example 2.
Figure 6B:
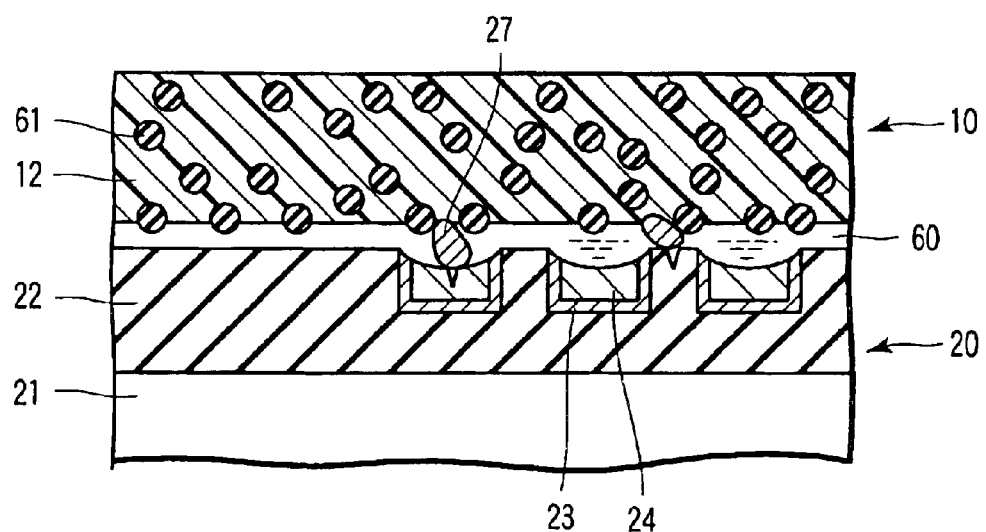

FIGS. 5A and 5B are cross-sectional views schematically showing the CMP treatment for Comparative Example 1. FIGS. 6A and 6B are cross-sectional views schematically showing the CMP treatment for Comparative Example 2. Further, FIGS. 7A and 7B are cross-sectional views schematically showing the CMP treatment for Comparative Example 3.

In the CMP treatment for Comparative Example 1, a slurry containing the abrasive particles 61, which did not exhibit the photocatalysis, and the dispersant 62 containing an oxidant, etc. was used as the fluid 60, as pointed out previously. Therefore, a denatured layer 26 containing a copper complex compound is formed on the surface of the metal film 24 which was brought into contact with the dispersant 62 containing the oxidant. It is difficult to remove the particular denatured layer 26, compared with the denatured layer 25 of $CuO_x$. It follows that it is impossible for the CMP treatment for Comparative Example 1 to achieve a polishing rate as high as that achieved by the CMP treatment for Example 1.

It should also be noted that, in the CMP treatment for Comparative Example 1, the denatured layer 26 is formed not only on the upper surface of the protruding portion of the metal film 24 but also on the bottom surface of the recessed portion of the metal film 24, as shown in FIG. 5A. In the CMP treatment for Example 1, however, the denatured layer 25 is scarcely formed on the bottom surface of the recessed portion of the metal film 24 and is formed essentially only on the upper surface of the protruding portion of the metal film 24 because the abrasive particles 11 are utilized as the oxidant in Example 1. Such being the situation, the dishing and erosion tend to be generated easily in the CMP treatment for Comparative Example 1, compared with the CMP treatment for Example 1.

Further, in the CMP treatment for Comparative Example 1, used is the polishing pad 10 having a hydrophobic polishing surface. As a result, the hydrophobic processing waste 27 is not discharged to the outside promptly through the clearance between the polishing pad 10 and the substrate 20. It follows that scratches are generated on the polished surface of the substrate 20. In the CMP treatment for Example 1, however, the polishing surface of the polishing member 10 is rendered hydrophilic by the light irradiation, with the result that the hydrophobic processing waste 27 is promptly discharged to the outside through the clearance between the polishing member 10 and the substrate 20. Such being the situation, a markedly large amount of scratches are generated in the CMP treatment for Comparative Example 1, compared with the CMP treatment for Example 1.

In the CMP treatment for Comparative Example 2, a solution containing an oxidant, etc. was used as the fluid 60 as pointed out previously. As a result, the denatured layer 26 containing a copper complex compound was formed on the surface of the metal film 24 which was brought into contact with the solution 60 containing the oxidant. It follows that it was impossible for the CMP treatment for Comparative Example 2 as well as the CMP treatment for Comparative Example 1 to achieve a polishing rate as high as that for the CMP treatment for Example 1. Also, the dishing and erosion were easily formed in the CMP treatment for Comparative Example 2, as shown in FIG. 6B. Further, in the CMP treatment for Comparative Example 2, which used the polishing pad 10 having a hydrophobic polishing surface, scratches tended to be formed easily as shown in FIG. 6B by the reasons similar to those described previously in conjunction with Comparative Example 1

Incidentally, the CMP treatment for Comparative Example 2 permits a high polishing rate and also permits suppression of the dishing and erosion, compared with the CMP treatment for Comparative Example 1. It should be noted in this connection that, in Comparative Example 2, the abrasive particles 61 were not suspended in the fluid 60 but were fixed to the polishing pad 10. In other words, a fixed abrasive polishing was performed in Comparative Example 2 so as to produce the effects somewhat superior to those produced in Comparative Example 1.

In the CMP treatment for Comparative Example 3, the abrasive particles 11 were used as the oxidant. The denatured layer 25 formed by the function of the abrasive particles 11 to oxidize the surface of the metal layer 24 is a brittle $CuO_x$ layer. As a result, the CMP treatment for Comparative Example 3 permits realizing a high polishing rate, compared with the CMP treatment for each of Comparative Examples 1 and 2. However, in the CMP treatment for Comparative Example 3, the abrasive particles 11 enter the recessed portion formed on the surface to be polished as shown in FIG. 7A because the abrasive particles 11 are suspended in the fluid 60. Therefore, in the portion having a high pattern density, it is difficult to bring the abrasive particles 11 into contact with the upper surface of the protruding portion of the convex portion of the surface to be polished, resulting in failure to achieve a polishing rate as high as that in the CMP treatment for Example 1.

It should also be noted that, in Comparative Example 3, the denatured layer 25 is formed mainly on the upper surface of the protruding portion of the metal film 24. However, since the abrasive particles 11 are suspended in the fluid 60, it is also possible for the denatured layer 25 to be formed in the bottom surface of the recessed portion as well as on the upper surface of the protruding portion of the metal film 24. It follows that, in the CMP treatment for Comparative Example 3, it is impossible to suppress the dishing and erosion as in the CMP treatment for Example 1, though the effect of suppressing the dishing and erosion produced by the CMP treatment for Comparative Example 3 is certainly higher than that produced by the CMP treatment for each of Comparative Examples 1 and 2.

It should also be noted that, in the CMP treatment for Comparative Example 3, which uses the polishing pad 10 having a hydrophobic polishing surface, scratches tend to be generated easily for reasons similar to those described previously in conjunction with Comparative Example 1. Incidentally, in the CMP treatment for Comparative Example 3, a $CuO_X$ layer is formed as the denatured layer 25. It follows that the processing waste 27 for Comparative Example 3 differs in composition from the processing waste 27 generated by the CMP treatment for each of Comparative Examples 1 and 2. Under the circumstances, it is considered reasonable to understand that the number of scratches generated in the CMP treatment for Comparative Example 3 is suppressed to some extent, compared with the CMP treatment for each of Comparative Examples 1 and 2.

Further, in the CMP treatment for Comparative Example 3, the abrasive particles 11 are suspended in the fluid 60 and, thus, the abrasive particles 11 tend to be distributed nonuniform on the surface to be polished. It should be noted that the oxidation of the surface to be polished by the abrasive particles 11 proceeds in mainly a contact region with the abrasive particles. Therefore, the denatured layer 25 is less likely to be formed in the region in which the abrasive particles 11 are distributed at a low density than in the region in which the abrasive particles 11 are distributed at a high density. In other words, the polishing rate tends to be nonuniform. Such being the situation, the frequency of the metal residue generation is high in the CMP treatment for Comparative Example 3, as shown in FIG. 4A.

Figure 8:
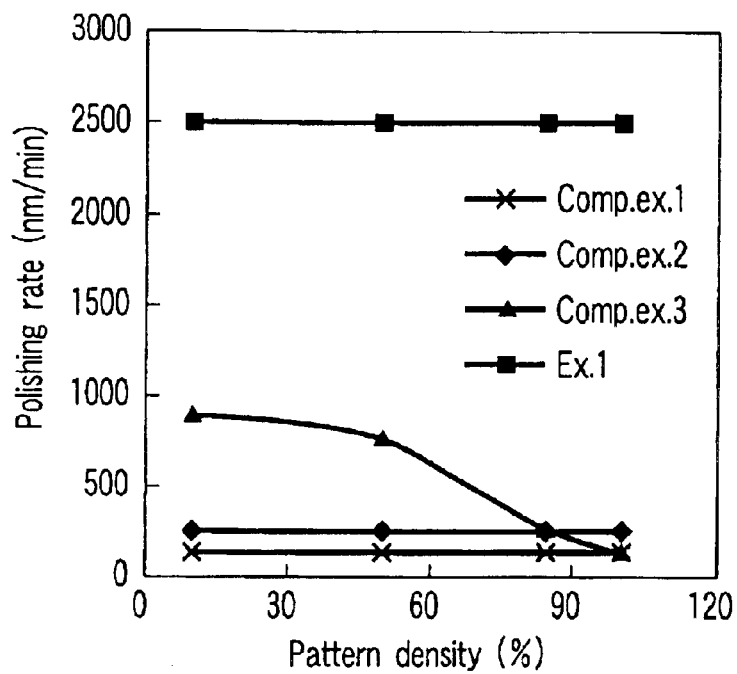
FIG. 8 is a graph showing the relationship between the pattern density and the polishing rate in respect of each of Example 1 and Comparative Examples 1 to 3.

The influences given by the pattern density to the polishing rate were examined in detail, with the results as shown in FIG. 8.

Specifically, FIG. 8 is a graph showing the relationship between the pattern density and the polishing rate obtained by the CMP treatment for each of Example 1 and Comparative Examples 1 to 3. In the graph of FIG. 8, the pattern density is plotted on the abscissa, with the polishing rate being plotted on the ordinate. As shown in FIG. 8, the polishing rate was low in the CMP treatment for each of Comparative Examples 1 and 2, though the polishing rate was scarcely dependent on the pattern density in the CMP treatment noted above. Also, in the CMP treatment for Comparative Example 3, it was possible to obtain a high polishing rate, compared with the CMP treatment for each of Comparative Examples 1 and 2, in the case where the pattern density is low. However, the polishing rate was markedly lowered with increase in the pattern density. In the CMP treatment for Example 1, however, the polishing rate was scarcely dependent on the pattern density. In addition, it was possible to obtain a high polishing rate.

Figure 9:
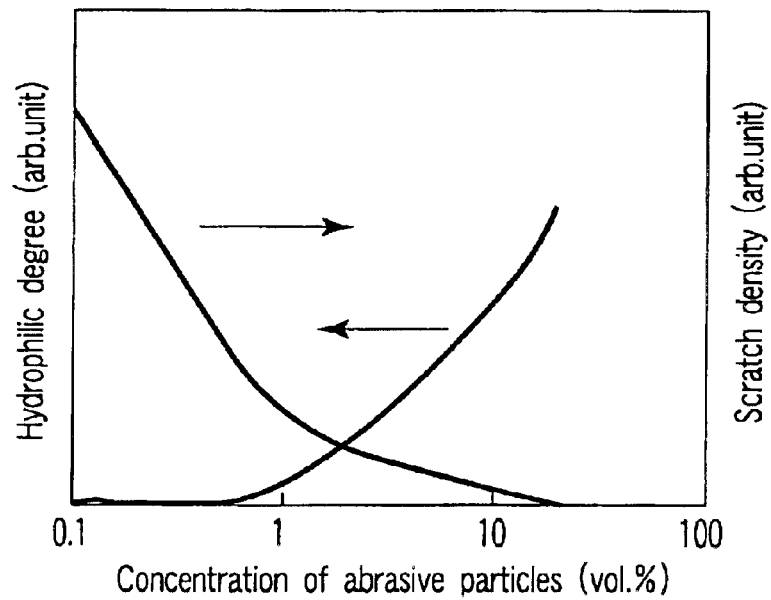
FIG. 9 is a graph showing the relationship between the hydrophilic degree of the polishing surface and the scratch density.

Also, the relationship between the hydrophilic degree of the polishing surface and the scratch density was examined in detail. To be more specific, the CMP treatment for Example 1 was performed by changing the concentration of the abrasive particles in the polishing pad 10, and the hydrophilic degree of the polishing surface was examined by measuring the contact angle between the polishing surface and the water surface by using a contact angle meter. FIG. 9 shows the results.

To be more specific, FIG. 9 is a graph showing the relationship between the hydrophilic degree of the polishing surface and the scratch density. In the graph of FIG. 9, the concentration of the abrasive particles 11 in the polishing pad 10 is plotted on the abscissa. On the other hand, the hydrophilic degree of the polishing surface and the density of the scratches formed on the surface of the metal film 24 are plotted on the ordinates. As shown in FIG. 9, the concentration of the abrasive particles 11, the hydrophilic degree of the polishing surface, and the scratch density are closely related to each other. Particularly, where the concentration of the abrasive particles 11 is not lower than 10% by volume, it is possible to prevent the scratch generation substantially completely.

As described above, according to the first embodiment, it is possible to make hydrophilic the polishing surface that is generally hydrophobic by means of the light irradiation. Therefore, it is possible to suppress the scratch generation and to suppress the loading of the polishing member 10. It should also be noted that, since it is possible to make the polishing surface of the polishing member 10 hydrophobic by stopping the light irradiation, it is possible to easily remove the hydrophilic processing waste and the reaction products even if attached to the polishing surface of the polishing member 10.

Further, according to the first embodiment, it is possible to use as the fluid 60 a liquid material that does not contain any of the abrasive particles and the oxidant, e.g., a fluid consisting essentially of water or a mixture of water and a pH adjuster such as nitric acid or hydrochloric acid. The fluid 60 of this particular construction is very cheap. In addition, in the case of carrying out the CMP treatment by using the fluid 60, the waste water accompanying the CMP treatment can be discarded easily because the abrasive particles or the oxidants are not contained in the waste water. Further, according to the first embodiment, the consumption of the abrasive particles can be suppressed to a low level in the case of utilizing the photocatalyst particles 11 as the fixed abrasive particles. It follows that, according to the first embodiment, it is possible to lower the cost relating to the CMP treatment. Incidentally, the expression "a fluid consisting essentially of water or a mixture of water and a pH adjuster" referred to above implies that it is possible for the fluid 60 to contain unavoidable impurities in addition to water or a mixture of water and a pH adjuster.

Where the polishing member 10 contains the photocatalyst particles 11 alone as the abrasive particles and the fluid 60 does not contain any of the oxidant and the abrasive particles in the first embodiment described above, it is possible for the particle diameters of the photocatalyst particles 11 to be distributed within a range of between, for example, 5 nm and 100 nm, or to fall within a range of between 5 nm and 20 nm. Where the particle diameters of the photocatalyst particles 11 are excessively small, the mechanical polishing force may be lowered, which makes it difficult to achieve a high polishing rate. On the other hand, where the particle diameters of the photocatalyst particles 11 are excessively large, it is highly probable for the holes generated inside the photocatalyst particles 11 to be recombined with the electrons before the holes are migrated to reach the surface, which lowers the effect of increasing the hydrophilic degree and the effect of strengthening the oxidizing force produced by the light irradiation.

It should also be noted that, where the polishing member 10 contains the photocatalyst particles 11 alone as the abrasive particles and the fluid 60 does not contain any of the oxidant and the abrasive particles, it is possible for the concentration of the photocatalyst particles 11 in the polishing member 10 to be set to fall within a range of, for example, between 10% by volume and 90% by volume. Where the concentration of the photocatalyst particles is lower than 10% by volume, it is difficult to obtain a high polishing rate. Also, since the effect of increasing the hydrophilic degree produced by the light irradiation is low, it is difficult to sufficiently suppress the scratch generation. On the other hand, if the concentration of the photocatalyst particles 11 exceeds 90% by volume, the hardness of the polishing member 10 is rendered excessively high, which could cause the scratch generation.

Where the photocatalyst particles 11 are utilized as the oxidizing agent, it is possible for the pH value of the fluid 60 to fall within, for example, a range of between 1.5 and 7 or between 2 and 4. If the pH value of the fluid 60 is larger than 7, a $Cu(OH)_X$ film, which is unlikely to be removed mechanically, is formed as the denatured layer 25, which makes it difficult to achieve a high polishing rate. On the other hand, if the pH value of the fluid 60 is excessively small, the metal etching is rendered predominant.

The surface of the workpiece such as substrate 20 may be a surface of a layer that contains metals, alloys, metal nitrides, metal borides, metal oxides or metal compounds containing at least two of nitrogen, boron and oxygen. In this case, the material in the layer may contain as a constituent element thereof a metal element such as aluminum, copper, tungsten, titanium, molybdenum, niobium, tantalum or vanadium.

Second Embodiment

A second embodiment of the present invention will now be described.

The second embodiment is substantially equal to the first embodiment described above, except that, in the second embodiment, at least one metal element selected from the group consisting of platinum, nickel, copper, silver, gold, and niobium is supported by the photocatalyst particles 11. If the metal element noted above is supported by the photocatalyst particle 11 described previously in conjunction with the first embodiment, the life of the hole generated by the irradiation of the photocatalyst particle 11 with light is prolonged. The following description covers the case where the photocatalyst particle 11 is a titanium oxide particle.

If titanium oxide is irradiated with light having an energy higher than the band gap, electrons and holes are generated by the optical excitation. The holes thus generated play the role of enhancing the hydrophilic degree and the oxidizing force of the titanium oxide particle. However, these electrons and holes tend to be recombined easily. It follows that the hydrophilic degree and the oxidizing force of the titanium oxide particle is limited by the life of the hole.

If the metal element noted above, e.g., platinum, is supported on the titanium oxide particle, the electrons generated by the light irradiation are involved in the reducing reaction denoted by the reaction formula given below, which is carried out in the presence of platinum:

$$2H^+ + 2e^- \rightarrow H_2$$

As a result, it is possible to lower the probability of the recombination between the electron and the hole. It follows that the effect of increasing the hydrophilic degree and the oxidizing force of the titanium oxide particle, which is generated by the light irradiation, is increased, which makes it possible to effectively suppress the scratch generation and to realize a high polishing rate.

In the second embodiment, it is possible for the coverage, i.e., an area ratio of the surface of the photocatalyst particle 11 that is covered with the metal element with respect to the whole surface of the photocatalyst particle 11, to fall within, for example, a range of between 5% and 90% or between 10% and 60%. If the coverage of the metal element is excessively low, the effect produced by the supporting of the metal element on the photocatalyst particle 11 fails to be produced prominently in many cases. On the other hand, if the coverage noted above is excessively high, the photocatalysis performed by the photocatalyst particle 11 tends to be obstructed because, for example, the light receiving area of the photocatalyst particle 11 is made excessively small.

Third Embodiment

A third embodiment of the present invention will now be described.

The third embodiment is substantially equal to the first embodiment described previously, except that, in the third embodiment, TiON particles prepared by doping titanium oxide with nitrogen or TiOS particles prepared by doping titanium oxide with sulfur are used as the photocatalyst particles 11. If titanium oxide is doped with nitrogen and/or sulfur, a new energy level is generated between the valence band and the conduction band of titanium oxide. As a result, an effective band gap is diminished, compared with titanium oxide so as to make it possible to sufficiently develop the photocatalysis by irradiation with light having a lower energy, i.e., the light having a longer wavelength. To be more specific, in the case of using titanium oxide particles as the photocatalyst particles 11, it is necessary to irradiate the photocatalyst particles 11 with an ultraviolet light in order to permit the photocatalysis to be developed sufficiently. In the case of using TiON particles as the photocatalyst particles 11, however, it is possible to permit the photocatalysis to be developed sufficiently by irradiation with a visible light. It follows that, according to the third embodiment, it is possible to carry out the CMP treatment described previously in conjunction with the first embodiment without using ultraviolet light, which is harmful to the human body.

The photocatalyst particles 11 prepared by doping titanium oxide with nitrogen and/or sulfur can be manufactured by, for example, various fine particle manufacturing methods, the sol-gel method or the chemical reaction method.

In the third embodiment, it is possible for the concentration of nitrogen and/or sulfur in the titanium oxide particle to be not higher than, for example, 10 atomic % or to be not higher than 2 atomic %. If the concentration of nitrogen and/or sulfur is excessively high, it is possible for the capability of the photocatalyst particles 11 as the photocatalyst to be lowered. Also, in the third embodiment, it is possible for the concentration of nitrogen and/or sulfur in titanium oxide to be not lower than, for example, 0.05 atomic % or to be not lower than 0.1 atomic %. If the concentration of nitrogen and/or sulfur is excessively low, it is difficult to permit the photocatalysis to be sufficiently developed by the irradiation with a visible light.

It is possible to combine the technology according to the second embodiment with the technology according to the third embodiment. This permits amplifying the effects described previously. Described in the following are an example of the technology according to the second embodiment, an example of the technology according to the third embodiment, and an example of the combination of the technologies according to the second and third embodiments.

EXAMPLE 2

The process described previously with reference to FIGS. 3A to 3D was carried out by a method similar to that described previously in conjunction with Example 1, except that titanium oxide particles supporting platinum were used as the photocatalyst particles 11. The coverage of the surface of the photocatalyst particle 11 with platinum was set at about 30%.

Next, the process described previously with reference to FIGS. 3A to 3D was carried out by a method similar to that described previously in conjunction with Example 1, except that the photocatalyst particles 11 supporting platinum noted above were used as the photocatalyst particles and that the CMP treatment was carried out while irradiating the polishing member 10 with visible light. In this case, a fluorescent lamp was used as the light source of visible light.

EXAMPLE 3

The process described previously with reference to FIGS. 3A to 3D was carried out by a method similar to that described previously in conjunction with Example 1, except that titanium oxide particles doped with nitrogen were used as the photocatalyst particles 11. The nitrogen concentration in the photocatalyst particles 11 was set at about 0.5 atomic %.

Next, the process described previously with reference to FIGS. 3A to 3D was carried out by a method similar to that described previously in conjunction with Example 1, except that the photocatalyst particles 11 doped with nitrogen were used as the photocatalyst particles and that the CMP treatment was carried out while irradiating the polishing member 10 with visible light. Incidentally, the light source similar to that used in Example 2 was used as the light source of visible light.

EXAMPLE 4

The process described previously with reference to FIGS. 3A to 3D was carried out by a method similar to that described previously in conjunction with Example 1, except that titanium oxide particles doped with nitrogen and supporting platinum were used as the photocatalyst particles 11. The nitrogen concentration in the photocatalyst particles 11 was set at about 0.5 atomic %, and the coverage of the surface of the photocatalyst particle 11 with platinum was set at about 30%.

Next, the process described previously with reference to FIGS. 3A to 3D was carried out by a method similar to that described previously in conjunction with Example 1, except that the photocatalyst particles 11 doped with nitrogen and supporting platinum were used as the photocatalyst particles and that the CMP treatment was carried out while irradiating the polishing member 10 with visible light. Incidentally, the light source similar to that used in Example 2 was used as the light source of visible light.

Figure 10:
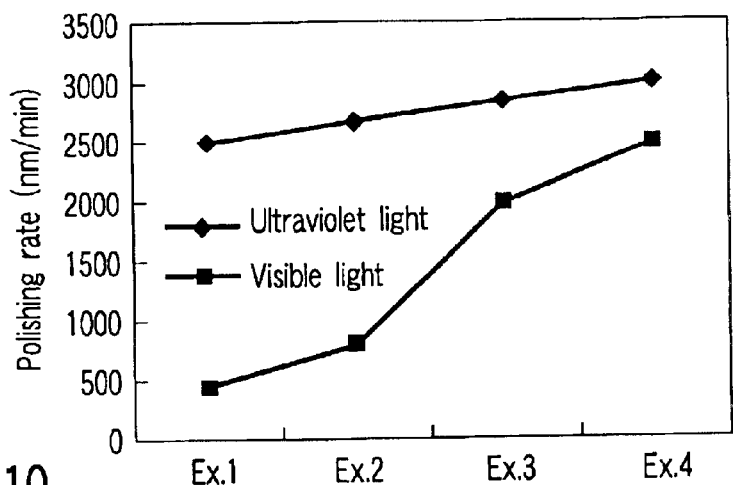
FIG. 10 is a graph showing the polishing rate in the CMP treatment for each of Examples 1 to 4 according to the present invention.

FIG. 10 is a graph showing the polishing rates for the CMP treatments in Examples 1 to 4. As shown in FIG. 10, in the case of utilizing ultraviolet light as the irradiation light, the polishing rate for each of Examples 2 and 3 was found to be higher than that for Example 1. Also, Example 4 was found to exhibit the highest polishing rate. Further, in the case of utilizing visible light as the irradiation light, the polishing rate for each of Examples 2 and 3 was found to be higher than that for Example 1. Also, Example 4 was found to exhibit the highest polishing rate.

Fourth Embodiment

A fourth embodiment of the present invention will now be described. The fourth embodiment is equal to the first embodiment described previously, except that, in the fourth embodiment, used is the polishing member 10 further containing inorganic particles.

Figure 11:
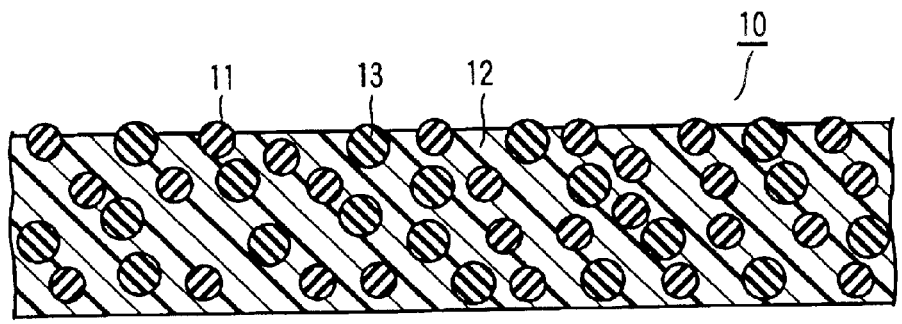
FIG. 11 is a cross-sectional view schematically showing a polishing member according to a fourth embodiment of the present invention.

FIG. 11 is a cross-sectional view schematically showing the construction of the polishing member 10 according to the fourth embodiment of the present invention. The polishing member 10 shown in FIG. 11 includes the photocatalyst particles 11, the support material 12, and inorganic particles 13. These inorganic particles 13 are particles containing a material that does not exhibit photocatalysis upon irradiation with light, such as alumina, silica, ceria, carbon, manganese dioxide, or a mixture thereof. These inorganic particles play the role of increasing the mechanical polishing force of the polishing member 10.

In the fourth embodiment, it is possible for the average particle diameter of the inorganic particles 13 to fall within, for example, a range of between 20 nm and 100 nm. If the particle diameter of the inorganic particle 13 is excessively small, it is difficult to sufficiently increase the mechanical polishing force of the polishing member 10. On the other hand, if the particle diameter of the inorganic particle 13 is excessively large, scratches tend to be generated. Regarding the photocatalyst particle 11, it is possible for the particle diameter to be not larger than, for example, 100 nm in order to increase the probability for the hole generated by the light irradiation to be migrated to reach the surface and to permit the hydrophilic degree and the oxidizing force of the photocatalyst particle 11 to be exhibited sufficiently. Incidentally, the lower limit is not particularly defined in this respect in terms of the average particle diameter of the photocatalyst particles 11.

Also, in order to sufficiently improve the mechanical polishing force of the polishing member 10, it is possible for the concentration of the inorganic particles 13 in the polishing member 10 to be, for example, not lower than 5% by volume. On the other hand, it is possible for the concentration of the photocatalyst particles 11 to be, for example, not lower than 10% by volume in order to permit the light irradiation to sufficiently improve the effect of increasing the hydrophilic degree and the effect of strengthening the oxidizing force for realizing a high polishing rate and for suppressing the scratch generation. Further, it is possible for the sum of the concentration of the photocatalyst particles 11 and the concentration of the inorganic particles 13 in the polishing member 10 to be not higher than, for example, 90% by volume. If the sum noted above exceeds 90% by volume, it is possible for the scratches to be generated with a high probability.

Incidentally, in a slurry containing, for example, titanium oxide particles and silica particles, these particles tend to be agglomerated easily because titanium oxide and silica are charged in opposite polarities. Such being the situation, where both the photocatalyst particles 11 and the inorganic particles 13 are contained in the fluid 60, not in the polishing member 10, it is possible for these particles 11 and 13 to be agglomerated, which lowers the catalytic activity of the photocatalyst particles 11. As a result, the polishing rate is markedly lowered. For example, in the case of using a slurry containing titanium oxide particles and silica particles as the abrasive particles, it is possible for the polishing rate to be lowered to about 1/10 of the polishing rate in the case of using a slurry containing titanium oxide particles alone as the abrasive particles.

On the other hand, in the fourth embodiment, both the photocatalyst particles 11 and the inorganic particles 13 are contained in the polishing member 10 and, thus, the agglomeration noted above is not generated in the fluid 60. It follows that, according to the fourth embodiment, it is possible to obtain the effects similar to those described previously in conjunction with the first embodiment. In addition, it is possible to achieve a polishing rate higher than that achieved in the first embodiment. Examples in which both the photocatalyst particles 11 and the inorganic particles 13 are contained in the polishing member 10 will now be described.

EXAMPLE 5

The process described previously with reference to FIGS. 3A to 3D was carried out by a method similar to that described previously in conjunction with Example 1, except that used was the polishing member 10 further containing alumina particles having an average particle diameter of about 20 nm as the inorganic particles. In this case, the polishing member 10 contained about 10% by volume of the inorganic particles 13.

EXAMPLE 6

The process described previously with reference to FIGS. 3A to 3D was carried out by a method similar to that described previously in conjunction with Example 1, except that used was the polishing member 10 further containing silica particles having an average particle diameter of about 20 nm as the inorganic particles. In this case, the polishing member 10 contained about 10% by volume of the inorganic particles 13.

Figure 12:
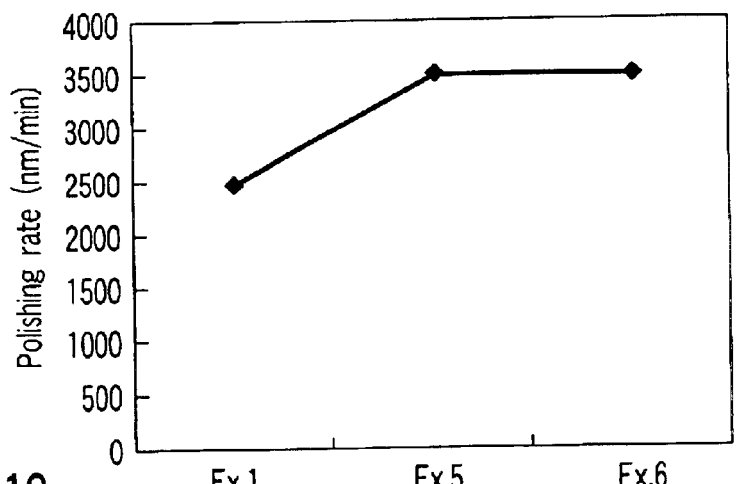
FIG. 12 is a graph showing the polishing rate in the CMP treatment for each of Examples 1, 5 and 6 according to the present invention.

FIG. 12 is a graph showing the polishing rates for the CMP treatments in Examples 1, 5 and 6 of the present invention. As shown in FIG. 12, the polishing rate for each of Examples 5 and 6 was found to be higher than that for Example 1.

It is possible to appropriately combine the technologies according to the first to fourth embodiments described above. For example, it is possible to combine the technology according to the second embodiment with the technology according to the third embodiment. It is also possible to combine the technology according to the fourth embodiment with the technology according to the second and/or third embodiment.

In each of the first to fourth embodiments described above, a buried wiring was formed by the process shown in FIGS. 3A to 3D. It is also possible to form a plug or to form simultaneously both a wiring and a plug by a similar process.

As described above, the polishing member contains the photocatalyst particles in the techniques. If the polishing member containing the photocatalyst particles is irradiated with light, the polishing surface of the polishing member is rendered hydrophilic by the photocatalysis performed by the photocatalyst particles, with the result that the hydrophobic processing waste is unlikely to be attached to the polishing surface. Also, it is possible to make the polishing surface hydrophilic by stopping the light irradiation. It follows that, even if hydrophilic processing waste and the reaction products are attached to the polishing surface, they can be removed easily. In other words, it is possible to provide a polishing member to which the processing waste is unlikely to be attached, and a method of manufacturing a semiconductor device in which the planarizing treatment is performed by using such a polishing member.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A polishing member comprising:
    photocatalyst particles that exhibit photocatalysis on light irradiation; and
    a support material that supports the photocatalyst particles, wherein the photocatalyst particles contain titanium, oxygen, and at least one of nitrogen and sulfur.

2. The member according to claim 1, wherein a concentration of nitrogen and/or sulfur in the photocatalyst particles falls within a range of 0.05 atomic % to 10 atomic %.

3. The member according to claim 1, further comprising inorganic particles that are supported by the support material together with the photocatalyst particles and contain at least one material selected from the group consisting of alumina, silica, ceria, carbon, and manganese dioxide.

4. The member according to claim 1, wherein particle diameters of the photocatalyst particles distribute within a range of 5 nm to 100 nm.

5. The member according to claim 1, wherein a concentration of the photocatalyst particles in the member falls within a range of 10% by volume to 90% by volume.

6. A polishing member comprising:
    photocatalyst particles that exhibit photocatalysis on light irradiation; and
    a support material that supports the photocatalyst particles, wherein each of the photocatalyst particles supports at least one metal element selected from the group consisting of platinum, nickel, copper, silver, gold, and niobium on a surface thereof.

7. The member according to claim 6, wherein an area ratio of surfaces of the photocatalyst particles that are covered with the metal element with respect to whole surfaces of the photocatalyst particles falls within a range of 5% to 90%.

8. The member according to claim 6, further comprising inorganic particles that are supported by the support material together with the photocatalyst particles and contain at least one material selected from the group consisting of alumina, silica, ceria, carbon, and manganese dioxide.

9. The member according to claim 6, wherein particle diameters of the photocatalyst particles distribute within a range of 5 nm to 100 nm.

10. The member according to claim 6, wherein a concentration of the photocatalyst particles in the member falls within a range of 10% by volume to 90% by volume.

11. The member according to claim 6, wherein the photocatalyst particles contain at least one compound selected from the group consisting of titanium oxide, tin oxide, niobium oxide, iron oxide, cadmium selenide, and cadmium sulfide.

12. A method of manufacturing a semiconductor device, comprising:

polishing a surface of a workpiece that is to be used as at least a portion of the semiconductor device with a polishing member with a fluid interposed between the polishing member and the surface of the workpiece while performing light irradiation onto the polishing member, the polishing member comprising photocatalyst particles that exhibit photocatalysis on the light irradiation and a support material that supports the photocatalyst particles, wherein the fluid does not contain oxidants.

13. The method according to claim 12, wherein the fluid consists essentially of water or a mixture of water and pH adjuster.

14. The method according to claim 12, wherein the light irradiation includes irradiating the polishing member with ultraviolet light and/or visible light.

15. The method according to claim 12, wherein the photocatalyst particles contain at least one compound selected from the group consisting of titanium oxide, tin oxide, niobium oxide, iron oxide, cadmium selenide, and cadmium sulfide.

16. The method according to claim 12, wherein the polishing member further comprises inorganic particles that are supported by the support material together with the photocatalyst particles and contain at least one material selected from the group consisting of alumina, silica, ceria, carbon, and manganese dioxide.

17. The method according to claim 12, wherein particle diameters of the photocatalyst particles distribute within a range of 5 nm to 100 nm.

18. The method according to claim 12, wherein a concentration of the photocatalyst particles in the member falls within a range of 10% by volume to 90% by volume.

19. The method according to claim 12, wherein the fluid does not contain abrasive particles.

20. The method according to claim 12, wherein the photocatalyst particles contain titanium, oxygen, and at least one element of nitrogen and sulfur.

21. The method according to claim 12, wherein each of the photocatalyst particles supports at least one metal element selected from the group consisting of platinum, nickel, copper, silver, gold, and niobium on a surface thereof.

22. A method of manufacturing a semiconductor device, comprising:

polishing a surface of a workpiece that is to be used as at least a portion of the semiconductor device with a polishing member with a fluid interposed between the polishing member and the surface of the workpiece while performing light irradiation onto the polishing member, the polishing member comprising photocatalyst particles that exhibit photocatalysis on the light irradiation and a support material that supports the photocatalyst particles, wherein the photocatalyst particles contain titanium, oxygen, and at least one element of nitrogen and sulfur.

23. The method according to claim 22, wherein a concentration of nitrogen and/or sulfur in the photocatalyst particles falls within a range of 0.05 atomic % to 10 atomic %.

24. The method according to claim 22, wherein the light irradiation includes irradiating the polishing member with visible light.

25. A method of manufacturing a semiconductor device, comprising:

polishing a surface of a workpiece that is to be used as at least a portion of the semiconductor device with a polishing member with a fluid interposed between the polishing member and the surface of the workpiece while performing light irradiation onto the polishing member, the polishing member comprising photocatalyst particles that exhibit photocatalysis on the light irradiation and a support material that supports the photocatalyst particles, wherein each of the photocatalyst particles supports at least one metal element selected from the group consisting of platinum, nickel, copper, silver, gold, and niobium on a surface thereof.

26. The method according to claim 25, wherein an area ratio of surfaces of the photocatalyst particles that are covered with the metal element with respect to whole surfaces of the photocatalyst particles falls within a range of 5% to 90%.

* * * * *